(12) United States Patent
Farooq et al.

(10) Patent No.: US 7,755,206 B2
(45) Date of Patent: Jul. 13, 2010

(54) PAD STRUCTURE TO PROVIDE IMPROVED STRESS RELIEF

(75) Inventors: Mukta G. Farooq, Hopewell Junction, NY (US); John A. Fitzsimmons, Poughkeepsie, NY (US); Thomas J. Fleischman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 11/947,184

(22) Filed: Nov. 29, 2007

(65) Prior Publication Data

US 2009/0140432 A1 Jun. 4, 2009

(51) Int. Cl.
*H01L 23/48* (2006.01)
(52) U.S. Cl. .................. 257/785; 257/734; 257/737; 257/779; 257/773
(58) Field of Classification Search ............... 257/668, 257/734, 737, 773, 779, 785, 782
See application file for complete search history.

(56) References Cited

U.S. PATENT DOCUMENTS

| | | | |
|---|---|---|---|
| 5,172,050 A | * | 12/1992 | Swapp ................. 324/762 |
| 5,299,939 A | | 4/1994 | Walker et al. |
| 6,287,126 B1 | | 9/2001 | Berger et al. |
| 6,396,711 B1 | | 5/2002 | Degani et al. |
| 6,407,927 B1 | | 6/2002 | Fasano |
| 6,532,654 B2 | | 3/2003 | Guerin et al. |
| 2002/0076910 A1 | * | 6/2002 | Pace ..................... 438/613 |

* cited by examiner

*Primary Examiner*—Leonardo Andújar
(74) *Attorney, Agent, or Firm*—Gibb I.P. Law Firm, LLC; Yuanmin Cai, Esq.

(57) ABSTRACT

A semiconductor interconnection comprises a semiconductor device, a substrate adjacent the semiconductor device, and a plurality of spring contacts on the semiconductor device or the substrate. A plurality of solder connections are on the opposite semiconductor device or substrate. Each spring contact comprises a contact surface and a conductive material on the contact surface. Upon assembly of the semiconductor device and the substrate, the conductive material on the plurality of spring contacts makes contact with each of the plurality of solder connections. The conductive material is in a liquid state at manufacturing or operating temperatures of the semiconductor device. Thus, the conductive material could be a solid at room temperature and transition to a liquid state at the semiconductor's manufacturing or operating temperatures.

1 Claim, 1 Drawing Sheet

PAD STRUCTURE TO PROVIDE IMPROVED STRESS RELIEF

BACKGROUND

1. Field of the Invention

The embodiments of the invention generally relate to semiconductor structure interconnects and more particularly to a spring interconnect structure that provides stress relief.

2. Summary

Semiconductor die (integrated circuits) are having increasing levels of complexity, performance, reliability and thermal demand being placed upon them. All technology roadmaps point to size factors as being required to decrease. There is much activity in the area of die interconnect to the package. High density interconnects typically use Controlled Chip Collapse Connection (C4) technology (though it is not required for this invention). The industry is moving to smaller C4 ball size and Lead-free materials, both of which result in higher stresses being placed directly upon the interconnect. Thermal and reliability demands also put these interconnects into modes which work against the high reliability requirements also being placed upon the interconnect.

Currently, the industry is attempting to manage the stresses at this interface a number of ways: 1) limiting thermal levels; 2) limiting thermal cycles; and 3) manipulating the Lead-free materials to reduce the stresses (though they typically increase costs), to name a few. Managing the stresses using the methods above, while effective, may not be the most effective way of dealing with the stresses. Therefore, the present disclosure utilizes a 'MEMs-switch-like' structure to allow for a controlled expansion at the joint, thus reducing the stresses at the fail location, and maintaining a low cost manufacturing process with higher reliability. "MEMs" refers to micro-electromechanical structures.

More specifically, the embodiments herein provide a semiconductor interconnection that comprises a semiconductor device, a substrate adjacent the semiconductor device, and a plurality of spring contacts on the semiconductor device or the substrate. A plurality of solder connections are on the opposite semiconductor device or substrate. Each spring contact comprises a contact surface and a conductive material on the contact surface. More specifically, each of the spring contacts comprises a beam and either: an empty gap below the beam; or a compressible material below the beam. Upon assembly of the semiconductor device and the substrate, the conductive material on the plurality of spring contacts makes contact with each of the plurality of solder connections. The conductive material is in a liquid state at manufacturing or operating temperatures of the semiconductor device. Thus, the conductive material could be a solid at room temperature and transition to a liquid state at the semiconductor's manufacturing or operating temperatures.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
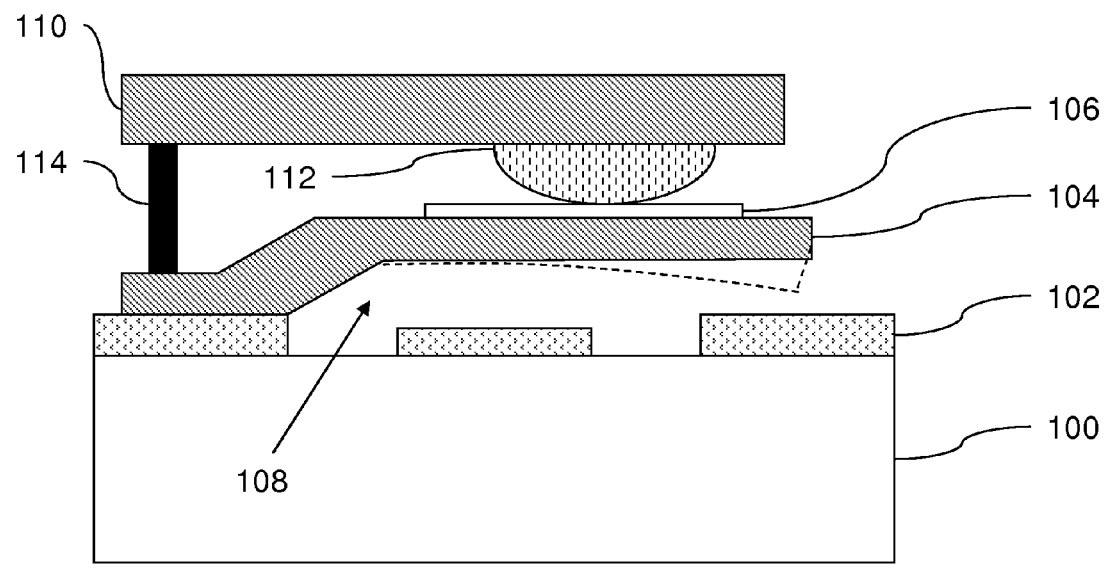
FIG. 1 is a schematic cross-sectional diagram of an interconnect according to embodiments herein.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, this disclosure provides a MEMs-like structure which serves as a low compression layer and allows the interconnect joint to expand into this region during the times when the expansion occurs (reflow, thermal cycles, etc.). It is shown in the industry that creation of a cavity 108 under a metal layer is not only possible, but can be CMOS compatible. For details regarding MEMs structures and interconnects, see U.S. Pat. No. 6,396,711, which is incorporated herein by reference. Such known details are not discussed herein to focus the reader on the salient features of the inventive structure.

Figure 2:
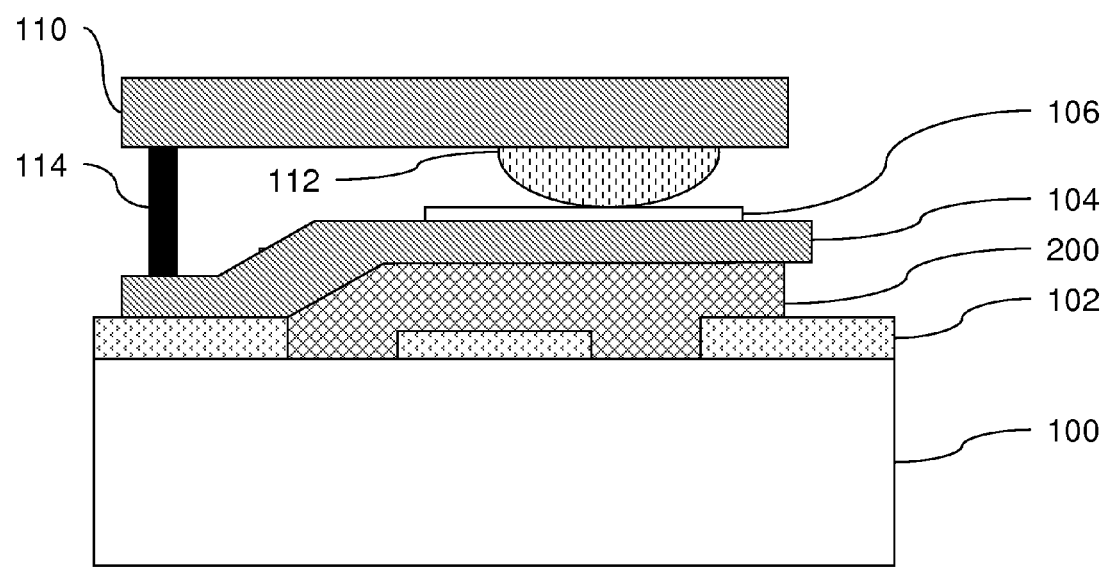
FIG. 2 is a schematic cross-sectional diagram of an interconnect according to embodiments herein.

As shown in FIG. 1, the invention forms a die pad structure which has a cavity 108 underneath the pad metallurgy. This cavity 108 can be empty (as shown in FIG. 1) or filled with a compressible material 200 that will allow the pad to flex/compress (as shown in FIG. 2). In addition, a peripheral underfill dam could be used to allow the underfill 200 to not inhibit the flexing of the beam.

As shown in FIG. 1, the inventive structure includes a metal 'beam' 104 that is the entire pad. Unlike conventional MEMs structures, with the inventive structure, there are no switch contacts below the pad 104. The complete pad surface makes contact to die interconnects wiring 112 to form connections to other layers 110. The manufacturing process used is complementary metal oxide semiconductor (CMOS) compatible and can provide different characteristics if the gap 108 is under the pad 104 or if it is filled (200).

FIGS. 1 and 2 illustrate the chip 100 and conductive structures 102 upon which the beam 104 is positioned. The beam 104 is a conducting protrusion and can be spherical or cylindrical or conical in shape. The beam 104 may be metallic in nature. When the chip 100 and the module 110 are joined, they are held together by an external connection, which ensures adequate scrubbing action between the conductive protrusion 112 on the upper substrate 110 and the beam 104 on the chip 100. This ensures electrical continuity. Note that, while the spring beam 104 is shown as being formed on the chip 100 and the solder connection 112 being formed on the module substrate 110, those ordinarily skilled in the art would understand that the positions could be reversed, and the beam 104 be positioned on the substrate 110 and the solder bump 112 on the chip 100. Further, while only one structure is shown, those ordinarily skilled in the art would understand that multiple such connections would be formed between the chip 100 and the substrate 110.

Upon heating, when there is differential expansion, the upper organic substrate (or ceramic substrate) 110 moves outward relative to the chip substrate 100, and the metallic contact 112 moves across the beam 104. The beam 104 is flexible in nature (as shown by the dashed lines in FIG. 1) and will elastically bend to accommodate the moving protrusion 112, without creating stress at the point (102) where the beam 104 is joined to the chip 100. Upon cooling, the movement will occur in the opposite direction. Again, very little or no stress is exerted at the point of contact (102) of the beam 104 to the chip 100. The beam 104 could employ bi-metallics to aid in providing stress relief.

The structure in FIGS. 1 and 2 can include a wetted contact 106 that comprises a conductive material that is in a liquid state during all modes of chip operation. The wetted contact 106 refreshes the beam 104 surface, improves and maintains resistance requirements, adds a degree of freedom in mechanical movement, and decreases stress at the contact point. More specifically, the material 106 is selected to have a melting point such that the conductive material 106 transitions from a solid to a liquid below the operational temperature. The conductive material 106 can include conductive alloys that are liquid within device operation parameters, examples of which include: Mercury, Gallium, Lead Alloys, Tin alloys, Bismuth alloys, Indium alloys.

Regarding assembly of the structure, a jig may be used to align the structures. The conductive material 106 can be "pre-tinned" (predeposited) with the conductive material 106 in a solid phase. The temperature can then be raised to liquidus and subsequently lowed to solidus, after which the jig can be removed and the structure will maintain its alignment. Pins or bars 114 can be used to maintain the alignment of the substrate 110 to chip 100. Such registration pins 114 may be on the edge of the chip 100 or through alignment holes in the chip 100. The bars 114 may be a continuous wall or "picket type" used to center the chip 100 with respect to the substrate 110. This permits limited movement in the Z-direction. Such registration bars 114 maintain the packages in alignment during the floating state when the contacts 106 are in liquid state.

Thus, as shown above, the embodiments herein provide a semiconductor interconnection that comprises a semiconductor device 100, a substrate 110 adjacent the semiconductor device 100, and a plurality of spring contacts 104 on the semiconductor device 100 or the substrate 110. A plurality of solder connections 112 are on the opposite semiconductor device 100 or substrate 110. Each spring contact 104 comprises a contact surface and a conductive material 106 on the contact surface. More specifically, each of the spring contacts comprises a beam 104 and either: an empty gap 108 below the beam 104; or a compressible material 200 below the beam 104. Upon assembly of the semiconductor device 100 and the substrate 110, the conductive material 106 on the plurality of spring contacts 104 makes contact with each of the plurality of solder connections 112. The conductive material 106 is in a liquid state at manufacturing or operating temperatures of the semiconductor device 100. Thus, the conductive material 106 could be a solid at room temperature and transition to a liquid state at the semiconductor's manufacturing or operating temperatures.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A semiconductor interconnection comprising:
a semiconductor device;
a substrate adjacent said semiconductor device;
a plurality of spring contacts on one of said semiconductor device and said substrate wherein each spring contact comprises a contact surface and a conductive material on said contact surface; and
a plurality of solder connections on the other of said semiconductor device and said substrate, wherein upon assembly of said semiconductor device and said substrate, said conductive material on said plurality of spring contacts makes contact with each of said plurality of solder connections, and
wherein each of said spring contacts comprises a beam and a compressible material below said beam.

* * * * *